US007813368B2

(12) United States Patent
Ootaka

(10) Patent No.: US 7,813,368 B2
(45) Date of Patent: Oct. 12, 2010

(54) COMMUNICATION SYSTEM

(75) Inventor: Kouji Ootaka, Toyohashi (JP)

(73) Assignee: Denso Corporation, Kariya (JP)

( * ) Notice: Subject to any disclaimer, the term of this patent is extended or adjusted under 35 U.S.C. 154(b) by 659 days.

(21) Appl. No.: 11/787,909

(22) Filed: Apr. 18, 2007

(65) Prior Publication Data

US 2008/0018465 A1 Jan. 24, 2008

(30) Foreign Application Priority Data

May 10, 2006 (JP) ............................ 2006-131424

(51) Int. Cl.
*G06F 3/041* (2006.01)
*G06F 15/16* (2006.01)
*H04J 3/06* (2006.01)
*H03K 19/094* (2006.01)

(52) U.S. Cl. ....................... 370/419; 700/209; 700/245; 370/474; 370/475; 370/503; 326/98; 326/105

(58) Field of Classification Search ......... 370/228–503; 709/224–245; 326/98–106
See application file for complete search history.

(56) References Cited

U.S. PATENT DOCUMENTS 4,402,084 A * 8/1983 Jungmeister ................ 375/214
4,511,895 A * 4/1985 Miller et al. ................ 370/462
5,709,219 A * 1/1998 Chen et al. .................. 600/595
6,014,596 A * 1/2000 Bess et al. ...................... 701/1
6,317,714 B1 * 11/2001 Del Castillo et al. ......... 704/270
6,404,326 B1 * 6/2002 Timmerman et al. ... 340/286.01
6,480,586 B1 * 11/2002 Hayes et al. ........... 379/102.02
6,667,685 B2 12/2003 Wasaki et al.
6,689,947 B2 * 2/2004 Ludwig ....................... 84/721
6,735,630 B1 * 5/2004 Gelvin et al. ............... 709/224
6,819,059 B2 11/2004 Block et al.
6,826,607 B1 * 11/2004 Gelvin et al. ............... 709/224
6,832,251 B1 * 12/2004 Gelvin et al. ............... 709/224

(Continued)

FOREIGN PATENT DOCUMENTS

EP 44555 A * 1/1982

(Continued)

OTHER PUBLICATIONS

Office action dated Jul. 9, 2009 in corresponding German Application No. 10 2007 017 804.4.

*Primary Examiner*—Salman Ahmed
*Assistant Examiner*—Venkatesh Haliyur
(74) *Attorney, Agent, or Firm*—Harness, Dickey & Pierce, PLC

(57) ABSTRACT

A communication system includes master and slave controllers, a local device connected to the slave controller, and a communication cable having a pair of wires and connected between the master and slave controllers. The master controller feeds a first DC voltage to the slave controller via the communication cable and communicates with the slave controller by changing the first DC voltage such that voltages on the wires of the communication cable are opposite in phase. The slave controller generates a second DC voltage from the first DC voltage and feeds the second DC voltage to the local device. When the master and slave controllers communicate with each other, the slave controller changes the second DC voltage such that voltages on terminals of the local device are opposite in phase and vary synchronously with the voltages on the communication cable.

8 Claims, 7 Drawing Sheets

U.S. PATENT DOCUMENTS

| | | | | |
|---|---|---|---|---|
| 6,922,082 | B2 * | 7/2005 | Wijeratne | 326/105 |
| 6,998,807 | B2 * | 2/2006 | Phillips et al. | 318/455 |
| 2002/0012401 | A1 * | 1/2002 | Karolys et al. | 375/257 |
| 2002/0136214 | A1 * | 9/2002 | Do et al. | 370/392 |

FOREIGN PATENT DOCUMENTS

| | | |
|---|---|---|
| JP | 2001-268137 | 9/2001 |
| JP | 2005-277546 | 10/2005 |

* cited by examiner

COMMUNICATION SYSTEM

CROSS REFERENCE TO RELATED APPLICATION

This application is based on and incorporates herein by reference Japanese Patent Application No. 2006-131424 filed on May 10, 2006.

FIELD OF THE INVENTION

The present invention relates to a communication system in which a master controller communicates with a slave controller connected to a local device.

BACKGROUND OF THE INVENTION

In recent years, many sensors have been mounted to a vehicle to collect a lot of vehicle information (e.g., speed) in order to accurately control many functions of the vehicle. The sensors are connected to a control unit via a communication cable and exchange information between one another.

In a conventional communication system shown in FIG. 9, a control unit 112 acting as a master controller is connected to a positive terminal of a battery 107 via an ignition switch 106 of a vehicle. A negative terminal of the battery 107 is connected to a frame ground FG, i.e., the negative terminal of the battery 107 is grounded to a frame (i.e., chassis) of the vehicle. A sensor apparatus 203 acting as a slave controller is connected to the control unit 112 via a communication cable 111 consisting of first and second wires. A sensor 202 acting as a local device is connected to the sensor apparatus 203.

The sensor apparatus 203 includes a power supply circuit (PS) 203*a*, a determination circuit (DT) 203*h*, and a communication interface circuit (I/O) 203*i*. The communication cable 111 is connected to the power supply circuit 203*a* via a first input terminal BA of the sensor apparatus 203. Also, the communication cable 111 is connected to the communication interface circuit 203*i* via a second input terminal BB of the sensor apparatus 203. The first and second wires of the communication cable 111 are connected to the first and second input terminals BA, BB, respectively. An output of the power supply circuit 203*a* is connected to a positive terminal 202*g* of the sensor 202 via a first output terminal SA of the sensor apparatus 203. A negative terminal 202*h* of the sensor 202 is connected to a signal ground SG of the sensor apparatus 203 via a second output terminal SB of the sensor apparatus 203.

As shown in FIG. 10, the control unit 112 has two phases, one of which is a feeding phase and the other of which is a communication phase. In the feeding phase, the control unit 112 feeds a first DC voltage with respect to the frame ground FG to the sensor apparatus 203 via the communication cable 111. In the commutation phase, the first DC voltage on the communication cable 111 is changed so that the control unit 112 communicates with the sensor apparatus 203. Specifically, in the communication phase, voltages on the first and second wires of the communication cable 111 are pulsed and opposite in phase. Accordingly, voltages at the first and second input terminals BA, BB of the sensor apparatus 203 are pulsed and opposite in phase, as shown in FIG. 10.

The power supply circuit 203*a* of the sensor apparatus 203 generates a second DC voltage from the first DC voltage and feeds the second DC voltage to the sensor 202. As shown in FIG. 11, in the feeding phase, the second DC voltage is fed with respect to the frame ground FG. However, in the communication phase, the second DC voltage varies with the first DC voltage and consequently is fed with respect to a potential higher than the frame ground FG. Further, the second DC voltage is pulsed synchronously with the first DC voltage such that voltages on the first and second output terminals SA, SB of the sensor apparatus 203 are in phase with each other. Therefore, if wires connecting the sensor 202 and the sensor apparatus 203 are long or the sensor 202 is constructed of linear conductors, the wires or the sensor 202 itself may act as an antenna and emit noise.

A communication system disclosed in JP-A-2005-277546 is designed to prevent the emission of noise. The communication system includes a master controller, a slave controller, and a communication cable for connecting the master and slave controllers. The slave controller is provided with a termination circuit. The termination circuit matches impedances between the slave controller and the communication cable, regardless of transition of the potential on the communication cable. Thus, impedance mismatching is prevented so that noise emitted by the communication cable and the slave controller can be reduced.

However, in the communication system shown in FIG. 9, the noise is caused by the fact that the second DC voltage is pulsed synchronously with the first DC voltage such that the voltages on the first and second terminals SA, SB are in phase with each other. In short, the impedance mismatching does not cause the noise in the communication system shown in FIG. 9. Therefore, the termination circuit used in the communication system disclosed in JP-A-2005-277546 cannot reduce the noise in the communication system shown in FIG. 9.

SUMMARY OF THE INVENTION

In view of the above-described problem, it is an object of the present invention to provide a communication system to reduce noise caused by a change in a direct current voltage fed from a slave controller to a local device.

A communication apparatus includes a master controller, a slave controller, a local device having positive and negative terminals and connected to the slave controller, and a communication cable having first and second wires and connected between the master controller and the slave controller.

The master controller has a feeding phase and a communication phase. In the feeding phase, the master controller feeds a first direct current voltage to the slave controller via the communication cable. In the communication phase, the master controller communicates with the slave controller by changing the first direct current voltage in such a manner that voltages on the first and second wires of the communication cable are opposite in phase.

The slave controller generates a second direct current voltage from the first direct current voltage and feeds the second direct current voltage to the local device. When the master controller and the slave controller communicate with each other, the slave controller changes the second direct current voltage in such a manner that voltages on the positive and negative terminals of the local device are opposite in phase and vary synchronously with the first direct current voltage. Thus, first electric field caused by first noise emitted from the positive terminal side is opposite in phase to second electric field caused by second noise emitted from the negative terminal side. The first and second electric fields cancel each other so that emission of noise from the local device can be reduced as a whole.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1:
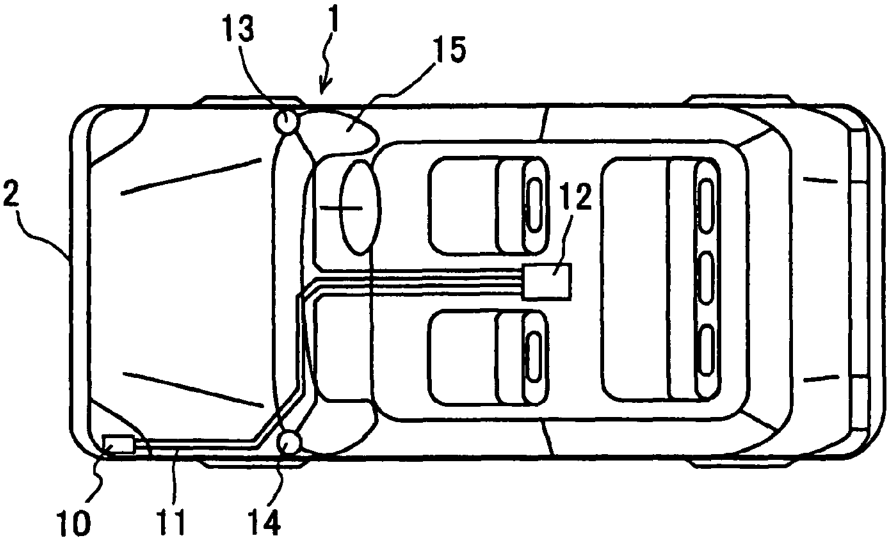
FIG. 1 is a top view of a vehicle provided with a pedestrian protection system according to an embodiment of the present invention.

As shown in FIG. 1, a pedestrian protection system 1 according to an embodiment of the present invention includes a pedestrian collision sensor 10, a communication cable 11 having a pair of first and second wires, a control unit 12 acting as a master controller, airbag inflators 13, 14, and a pillar airbag 15.

The collision sensor 10 is installed near a front bumper 2 of a vehicle to detect a collision between a pedestrian and the bumper 2. The collision sensor 10 outputs a detection result, which indicates whether the collision occurs, to the control unit 12.

The control unit 12 feeds a DC voltage to the collision sensor 10 via the communication cable 11. Also, various data including the detection result is exchanged between the collision sensor 10 and the control unit 12 via the communication cable 11. The control unit 12 is generally mounted in the center of the vehicle and outputs a firing signal to the airbag inflators 13, 14 in accordance with the detection result received from the collision sensor 10.

The airbag inflators 13, 14 are mounted near a front pillar of the vehicle and inflate the pillar airbag 15 in response to the firing signal. The pillar airbag 15 is also mounted near the front pillar of the vehicle. When being inflated by the airbag inflators 13, 14, the pillar airbag 15 deploys and expands toward the front of a windshield of the vehicle to protect the pedestrian, who is hit by the bumper 2, from being hit by the front pillar.

Figure 2:
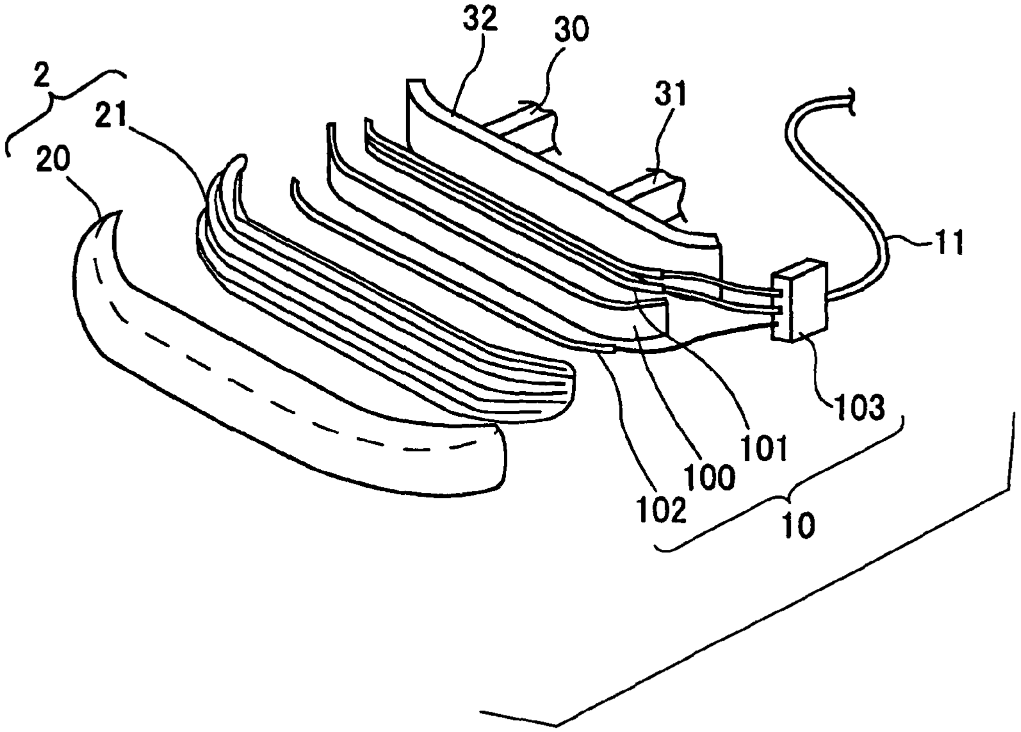
FIG. 2 is a partially exploded view of the pedestrian protection system.

As shown in FIG. 2, the collision sensor 10 includes a sensor supporting plate 100, a fiber-optic sensor 101, a touch sensor 102 acting as a local device, and a collision detection circuit 103 acting as a slave controller. The supporting plate 100 is approximately rectangle in shape and made of resin, for example. The supporting plate 100 supports the fiber-optic sensor 101 and the touch sensor 102. When impact force due to the collision is applied to the fiber-optic sensor 101, the amount of light transmitted by the fiber-optic sensor 101 decreases. Further, when the impact force due to the collision is applied to the touch sensor 102, the resistance of the touch sensor 102 decreases. Based on both the amount of light transmitted by the fiber-optic sensor 101 and the resistance of the touch sensor 102, the detection circuit 103 determines whether the collision between the pedestrian and the bumper 2 occurs.

The bumper 2 includes a bumper cover 20 and a bumper absorber 21. The bumper 2 is mounted to a bumper reinforcement 32. The bumper reinforcement 32 is fixed to tips of side members 30, 31 of a frame (i.e., chassis) of the vehicle. The bumper cover 20 is fixed to the bumper reinforcement 32 through the bumper absorber 21. The fiber-optic sensor 101 and the touch sensor 102, which are supported by the supporting plate 100, are sandwiched between the bumper absorber 21 and the bumper reinforcement 32. Each of the fiber-optic sensor 101 and the touch sensor 102 is connected to the detection circuit 103.

Figure 3A:
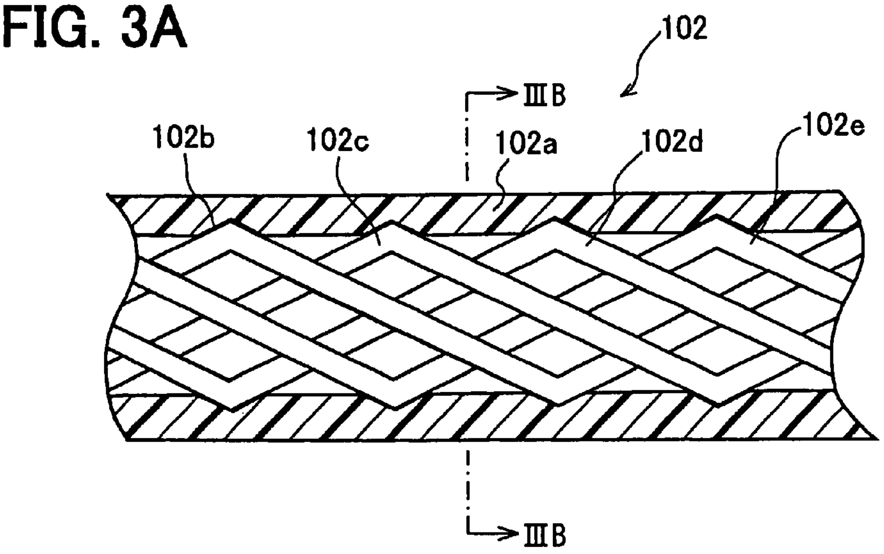
FIG. 3A is a longitudinal cross-sectional view of a touch sensor used in the pedestrian protection system.
Figure 3B:
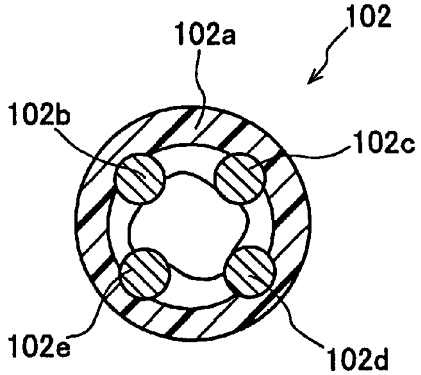
FIG. 3B is a cross-sectional view taken along line IIIB-IIIB of FIG. 3A.

The touch sensor 102 is described in detail below with reference to FIGS. 3A-6. As shown in FIGS. 3A and 3B, the touch sensor 102 includes an elastic tube 102*a* made of an electrically insulating material and linear conductors 102*b*-102*e* that are placed on an inner wall of the elastic tube 102*a*. The conductors 102*b*-102*e* extend along the length of the tube 102*a* in a helical manner to be electrically separated from each other. Specifically, the conductors 102*b*, 102*d* face each other across the center of the tube 102*a*. Likewise, the conductors 102*c*, 102*e* face each other across the center of the tube 102*a*.

Figure 4:
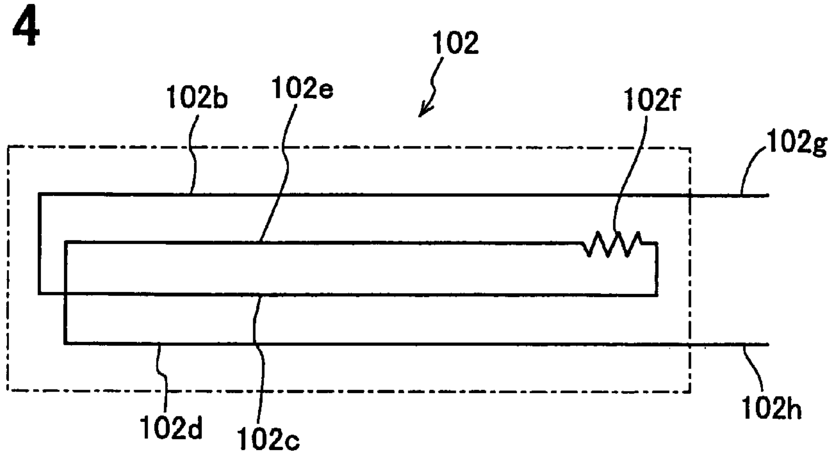
FIG. 4 is an equivalent circuit diagram of the touch sensor.

As shown in FIG. 4, the conductors 102*b*, 102*c* are electrically connected to each other at one end, and the conductors 102*d*, 102*e* are electrically connected to each other at one end. The conductors 102*c*, 102*e* are connected to each other via a resistor 102*f* at the other end. The other ends of the conductors 102*b*, 102*d* serve as positive and negative terminals 102*g*, 102*h* of the touch sensor 102, respectively.

Figure 5A:
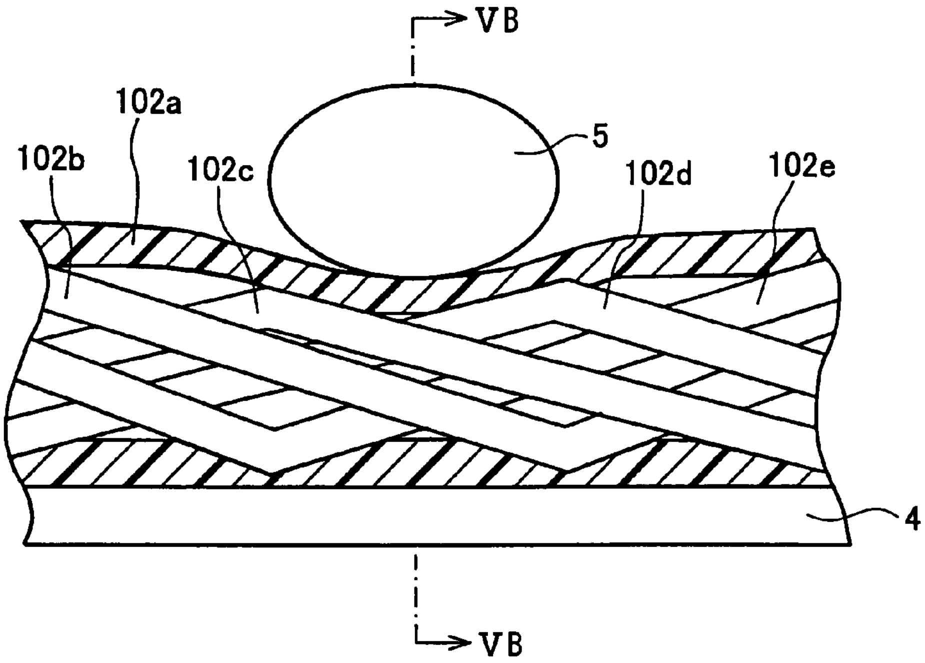
FIG. 5A is a longitudinal cross-sectional view of the touch sensor observed when an object collides with the touch sensor.
Figure 5B:
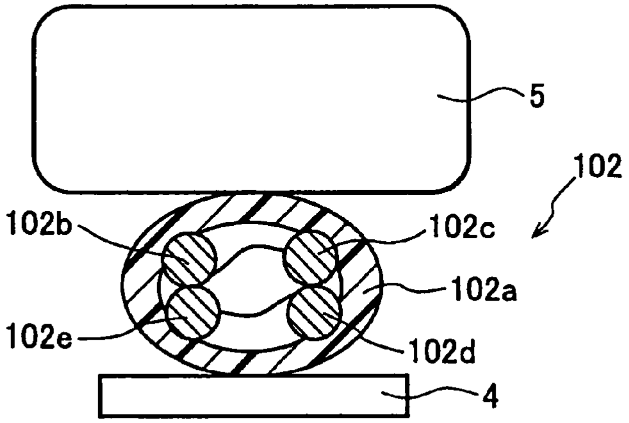
FIG. 5B is a cross-sectional view taken along line VB-VB of FIG. 5A.
Figure 6:
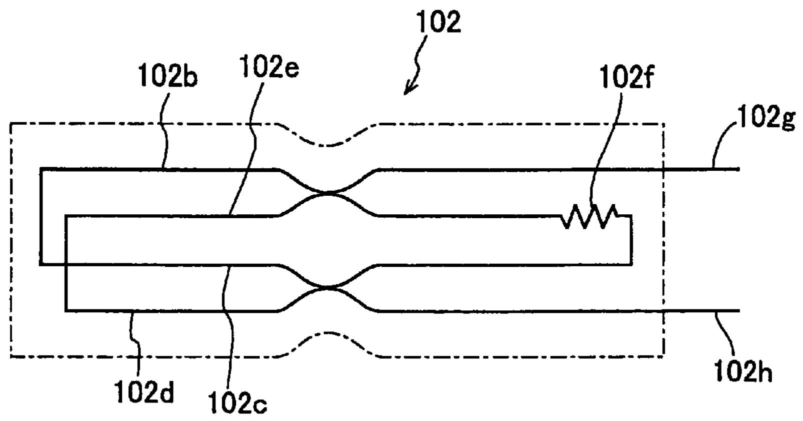
FIG. 6 is an equivalent circuit diagram of the touch sensor observed when the object collides with the touch sensor.

As shown in FIG. 5A, the touch sensor 102 is mounted on a base 4 (e.g., the sensor supporting plate 100) having stiffness. When an object 5 collides with the touch sensor 102, the tube 102*a* is deformed by the impact force due to the collision. Consequently, as shown in FIG. 5B, the conductors 102*b*, 102*e* electrically contact each other, and the conductors 102*c*, 102*d* electrically contact each other. As shown in FIG. 6, thus, the resistor 102*f* is short-circuited, and the resistance between the positive and negative terminals 102*g*, 102*h* of the touch sensor 102 is reduced. Therefore, when the impact force due to the collision is applied to the touch sensor 102, the resistance of the touch sensor 102 decreases.

Figure 7:
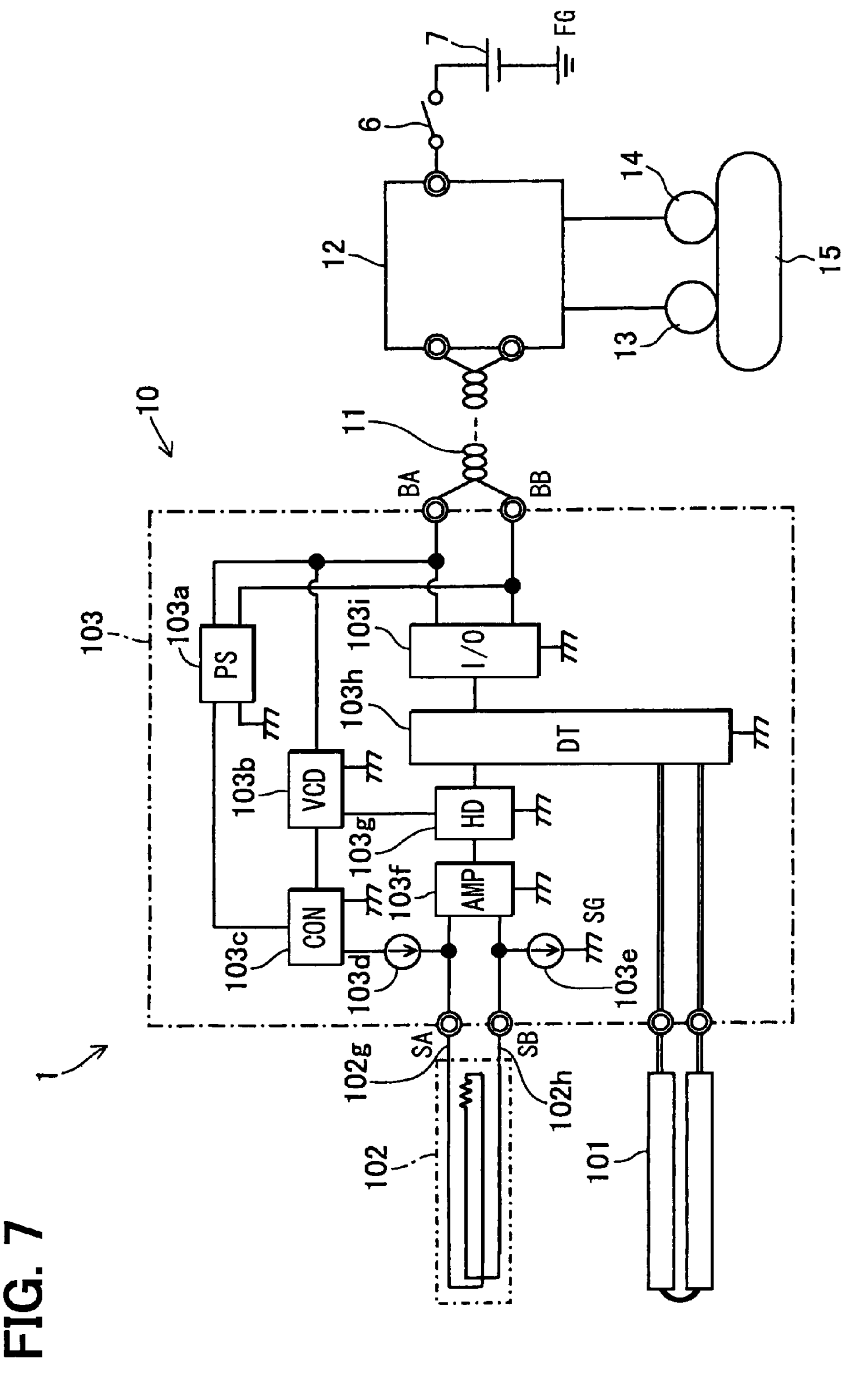
FIG. 7 is a block diagram of the pedestrian protection system.
Figure 9:
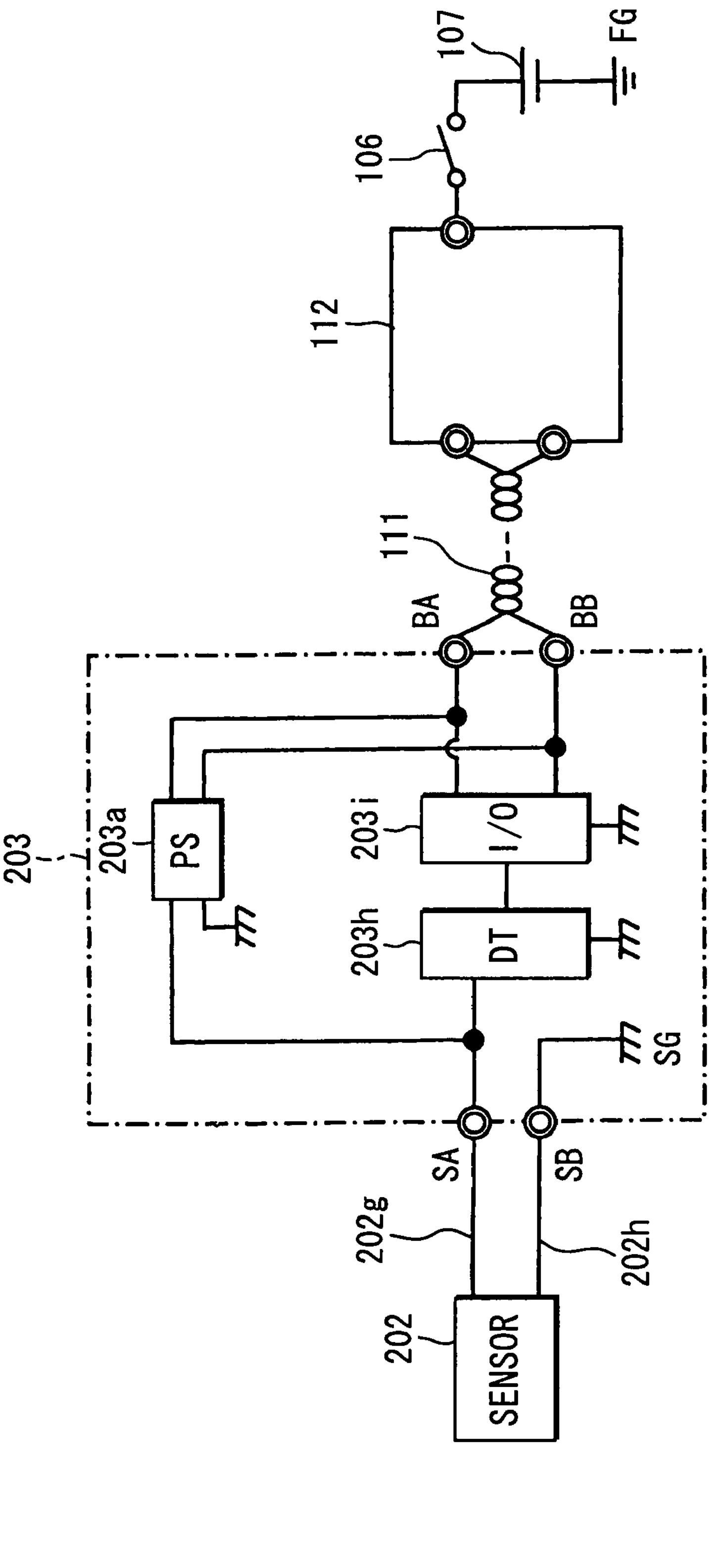
FIG. 9 PRIOR ART
FIG. 9 is a block diagram of a conventional communication system.
Figure 10:
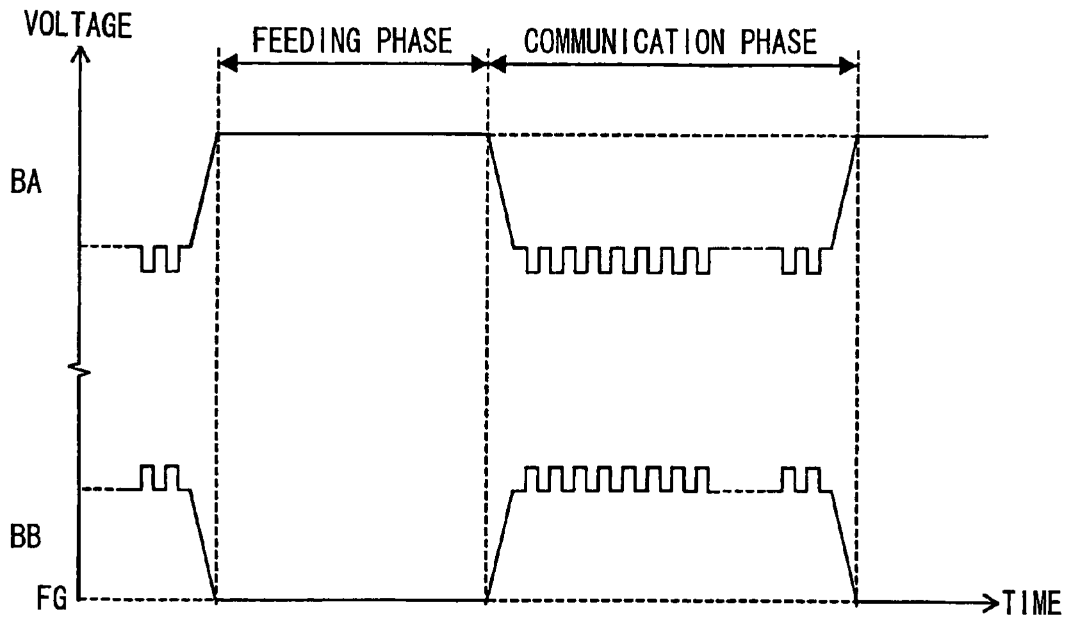
FIG. 10 PRIOR ART
FIG. 10 is a graph showing voltages at input terminals of a sensor apparatus used in the conventional communication system.
Figure 11:
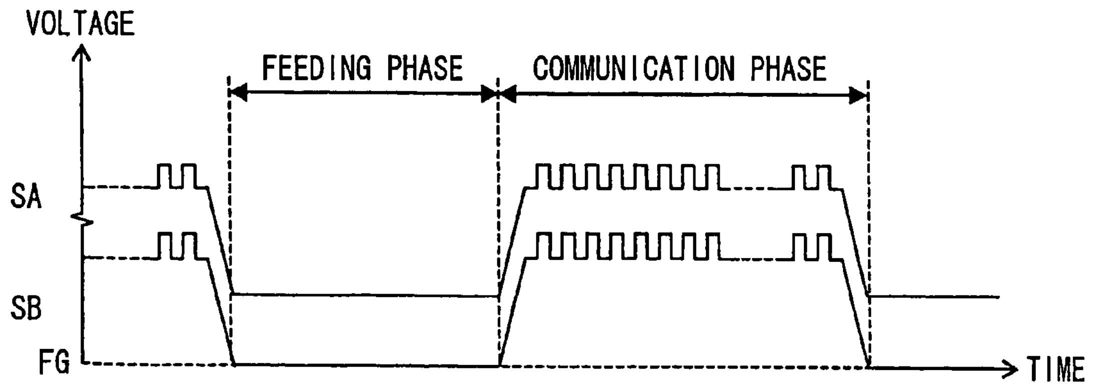
FIG. 11 PRIOR ART
FIG. 11 is a graph showing voltages at output terminals of the sensor apparatus used in the conventional communication system.

Next, the control unit 12 is described in detail with reference to FIG. 7. As shown in FIG. 7, the control unit 12 is connected to a positive terminal of a battery 7 via an ignition switch 6 of the vehicle and fed with a DC batter voltage. A negative terminal of the battery 7 is connected to a frame ground FG, i.e., the negative terminal of the battery 7 is grounded to the frame of the vehicle. Also, the control unit 12 is connected to each of the airbag inflators 13, 14.

Figure 8:
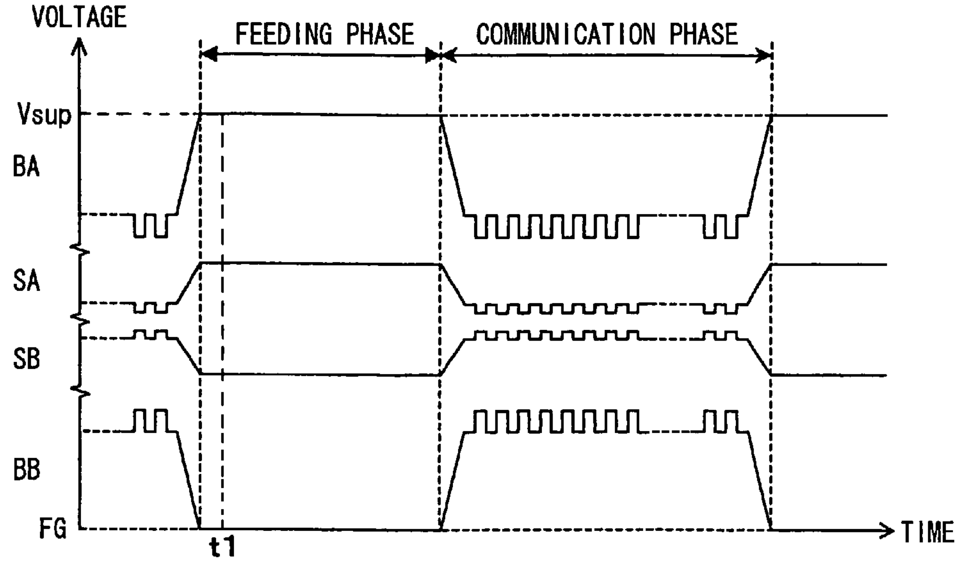
FIG. 8 is a graph showing voltages at input and output terminals of a collision detection circuit used in the pedestrian protection system.

The control unit 12 has two phases, one of which is a feeding phase and the other of which is a communication phase. In the feeding phase, the control unit 12 feeds a first DC voltage with respect to the frame ground FG to the collision sensor 10 via the communication cable 11. In the communication phase, the control unit 12 changes the first DC voltage to communicate with the collision sensor 10. Specifically, in the communication phase, voltages on the first and second wires of the communication cable 11 are changed (e.g., pulsed) and opposite in phase. Accordingly, voltages at first and second input terminals BA, BB of the detection circuit 103 are changed and opposite in phase, as shown in FIG. 8. The first DC voltage is to a voltage difference between the first and second input terminals BA, BB.

Thus, the control unit 12 communicates with the collision sensor 10 and receives the detection result from the collision sensor 10. The control unit 12 outputs the firing signal to the airbag inflators 13, 14 in accordance with the detection result.

The detection circuit 103 includes a power supply circuit (PS) 103*a*, a voltage change detection circuit (VCD) 103*b*, a voltage control circuit (CON) 103*c*, a positive-side constant current circuit 103*d*, a negative-side constant current circuit 103*e*, a differential amplifier (AMP) 103*f*, a holding circuit (HD) 103*g*, a determination circuit (DT) 103*h*, and a communication interface circuit (I/O) 103*i*.

The first DC voltage fed to the collision sensor 10 charges the power supply circuit 103*a* of the detection circuit 103. The charged power supply circuit 103*a* feeds a second DC voltage to the touch sensor 102 and each of the internal circuits, including the voltage control circuit 103*c*, of the detection circuit. The power supply circuit 103*a* has two inputs. One input of the power supply circuit 103*a* is connected to the first wire of the communication cable 11 via the first input terminal BA of the detection circuit 103. The other input of the power supply circuit 103*a* is connected to the second wire of the communication cable 11 via the second input terminal BB of the detection circuit 103. An output of the power supply circuit 103*a* is connected to each of the internal circuits including the voltage control circuit 103*c*.

The voltage change detection circuit 103*b* detects a change in voltage on the communication cable 11 and outputs a first signal corresponding to the voltage change. Also, the voltage change detection circuit 103*b* determines, based on the voltage change, whether the communication between the collision sensor 10 and the control unit 12 is completed and outputs a second signal corresponding to the communication status. An input of the voltage change detection circuit 103*b* is connected to the first wire of the communication cable 11 via the first input terminal BA. Two outputs of the voltage change detection circuit 103*b* are connected to the voltage control circuit 103*c* and the holding circuit 103*g*, respectively.

The voltage control circuit 103*c* reduces the second DC voltage outputted from the power supply circuit 103*a*. Also, the voltage control circuit 103*c* changes the second DC voltage synchronously with the first signal. As described above, the first signal is outputted from the voltage change detection circuit 103*b* and corresponds to the change in voltage on the communication cable 11. Therefore, the second DC voltage varies synchronously with the first DC voltage. Two inputs of the voltage control circuit 103*c* are connected to the outputs of the power supply circuit 103*a* and the voltage change detection circuit 103*b*, respectively. An output of the voltage control circuit 103*c* is connected to the positive-side constant current circuit 103*d*.

The positive-side constant current circuit 103*d* has an input connected to the output of the voltage control circuit 103*c*. The positive-side constant current circuit 103*d* has an output connected to the positive terminal 102*g* of the touch sensor 102 via a first output terminal SA. The positive-side constant current circuit 103*d* supplies a constant current to the positive terminal 102*g* via the first output terminal SA.

The negative-side constant current circuit 103*e* has an input connected to the negative terminal 102*h* of the touch sensor 102 via a second output terminal SB. The negative-side constant current circuit 103*e* has an output connected to a signal ground SG of the detection circuit 103. The negative-side constant current circuit 103*e* draws a constant current from the negative terminal 102*h* via the second output terminal SB. The second DC voltage is a voltage difference between the first and second output terminals SA, SB.

The differential amplifier 103*f* amplifies the difference in voltage between the positive and negative terminals 102*g*, 102*h* of the touch sensor 102. Two inputs of the differential amplifier 103*f* are connected to the positive and negative terminals 102*g*, 102*h* of the touch sensor 102 via the first and second output terminals SA, SB, respectively. An output of the differential amplifier 103*f* is connected to the holding circuit 103*g*.

The holding circuit 103*g* holds an output voltage of the differential amplifier 103*f* in accordance with the second signal. As described above, the second signal is outputted from the voltage change detection circuit 103*b* and corresponds to the communication status between the collision sensor 10 and the control unit 12. Two inputs of the holding circuit 103*g* are connected to the outputs of the voltage change detection circuit 103*b* and the differential amplifier 103*f*, respectively. An output of the holding circuit 103*g* is connected to the determination circuit 103*h*.

The determination circuit 103*h* operates according to command data that is received from the control unit 12 via the interface circuit 103*i*. The determination circuit 103*h* converts the outputs of the fiber-optic sensor 101 and the holding circuit 103*g* into detection data and outputs the detection data to the interface circuit 103*i*. An input of the determination circuit 103*h* is connected to the output of the holding circuit 103*g*. Further, the determination circuit 103*h* has an optical input, an optical output, and a data input/output. Each of the optical input and the optical output of the determination circuit 103*h* is connected to the fiber-optic sensor 101. The data input/output of the determination circuit 103*h* is connected to the interface circuit 103*i*.

In the communication phase, the control unit 12 sends a command signal to the interface circuit 103*i* by changing the first DC voltage in such a manner that the voltages on the first and second wires of the communication cable 11 are opposite in phase. The interface circuit 103*i* converts the command signal into the command data and outputs the command data to the determination circuit 103*h*. Also, the interface circuit 103*i* sends the detection data, which is received from the determination circuit 103*h*, to the control unit 12 by changing the first DC voltage in such a manner that the voltages on the first and second wires of the communication cable 11 are opposite in phase. The interface circuit 103*i* has two input/output terminals. One input/output terminal of the interface circuit 103*i* is connected to the first wire of the communication cable 11 via the first input terminal BA of the detection circuit 103. The other input/output terminal of the interface circuit 103*i* is connected to the second wire of the communication cable 11 via the second input terminal BB of the detection circuit 103.

During the operation of the pedestrian protection system 1, the voltages on the terminals BA, BB, SA, SB of the detection circuit 103 vary as shown in FIG. 8. When the ignition switch 6 of the vehicle is turned on, the control unit 12 is fed with the batter voltage of the battery 7 and starts its operation. The control unit 12 feeds the first DC voltage to the collision detection circuit 103 of the collision sensor 10 via the communication cable 11. As shown in FIG. 8, in the feeding phase, the first input terminal BA becomes a voltage Vsup, and the second input terminal BB becomes the frame ground FG.

When the control unit 12 feeds the first DC voltage to the collision detection circuit 103, the first DC voltage charges the power supply circuit 103*a* of the collision detection circuit 103. The charged power supply circuit 103*a* feeds the second DC voltage to the internal circuits of the collision detection circuit 103. Thus, the collision detection circuit 103 starts its operation. In the communication phase, the first DC voltage is changed so that the voltages on the first and second wires of the communication cable 11 are opposite in phase. In short, in the communication phase, the voltages on the first and second input terminals BA, BB of the detection circuit 103 are opposite in phase. Thus, the control unit 12 and the collision detection circuit 103 of the collision sensor 10 communicate with each other and exchanges various data including the command data and the detection data between each other. The feeding and communication phases are alternately repeated during the operation of the pedestrian protection system 1.

The voltage change detection circuit 103*b* outputs the first signal corresponding to the change in voltage on the communication cable 11. The voltage control circuit 103*c* reduces the second DC voltage and causes the second DC voltage to vary synchronously with the first signal. The output voltage of the voltage control circuit 103*c* is applied to the first output terminal SA, which is connected to the positive terminal 102*g* of the touch sensor 102, via the positive-side constant current circuit 103*d*. As shown in FIG. 8, therefore, the voltage on the first output terminal SA is less than the voltage on the first input terminal BA. Further, the voltage on the first output terminal SA varies synchronously with the voltage on the first input terminal BA so that the voltages on the terminals SA, BA are in phase.

The positive-side constant current circuit 103*d* supplies the constant current to the positive terminal of the touch sensor 102 via the first output terminal SA. Further, the negative-side constant current circuit 103*e* draws the constant current form the negative terminal of the touch sensor 102 via the second output terminal SB. As shown in FIG. 8, therefore the voltage on the second output terminal SB is less than the voltage on the first output terminal SA. Further, the voltage on the second output terminal SB is opposite in phase to the voltage on the first output terminal SA. As a result, the voltages on the positive and negative terminals 102*g*, 102*h* of the touch sensor 102 are opposite in phase and varies synchronously with the voltages on the communication cable 11. Therefore, first electric field caused by first noise emitted from the positive terminal 102*g* side is opposite in phase to second electric field caused by second noise emitted from the negative terminal 102*h* side. The first and second electric fields cancel each other so that emission of noise from the touch sensor 102 can be reduced as a whole.

The differential amplifier 103*f* amplifies the voltage between the positive and negative terminals 102*g*, 102*h* of the touch sensor 102. When the bumper 2 collides with the pedestrian, the touch sensor 102 is short-circuited so that the voltage between the positive and negative terminals 102*g*, 102*h* becomes approximately zero. As a result, the output voltage of the differential amplifier 103*f* also becomes approximately zero.

The voltage change detection circuit 103*b* determines, based on the change in voltage on the communication cable 11, whether the communication between the pedestrian collision sensor 10 and the control unit 12 is completed. Then, the voltage change detection circuit 103*b* outputs the second signal, corresponding to the communication status, to the holding circuit 103*g* at a time t1 shown in FIG. 8. In response to the second signal, the holding circuit 103*g* obtains the output voltage of the differential amplifier 103*f* at the time t1 and holds the obtained output voltage during the communication phase, where the second DC voltage varies. In such an approach, the change in the resistance of the touch sensor 102 can be surely detected, regardless of the fact that the second DC voltage varies.

The determination circuit 103*h* operates according to the command data that is received from the control unit 12 via the interface circuit 103*i*. The determination circuit 103*h* converts the outputs of the fiber-optic sensor 101 and the holding circuit 103*g* into the detection data and outputs the detection data to the interface circuit 103*i*.

The interface circuit 103*i* of the collision sensor 10 sends the detection data to the control unit 12 via the communication cable 11. The control unit 12 determines, based on the detection data, whether the collision between the bumper 2 and the pedestrian occurs. When the control unit 12 determines that the collision between the bumper 2 and the pedestrian occurs, the control unit 12 outputs the firing signal to the airbag inflators 13, 14. The airbag inflators 13, 14 inflate the pillar airbag 15 in response to the firing signal. Thus, the pedestrian protection system 1 protects the pedestrian from being hit by the front pillar.

In the pedestrian protection system 1 according to the embodiment, the power supply circuit 103*a*, the voltage change detection circuit 103*b*, the voltage control circuit 103*c*, the positive-side constant current circuit 103*d*, and the negative-side constant current circuit 103*e* works in conjunction with one another, so that the voltages on the positive and negative terminals 102*g*. 102*h* of the touch sensor 102 are opposite in phase and vary synchronously with the voltages on the first and second wires of the communication cable 11. Therefore, the first electric field caused by the first noise emitted from the positive terminal 102*g* side is opposite in phase to the second electric field caused by the second noise emitted from the negative terminal 102*h* side. The first and second electric fields cancel each other so that the emission of noise from the touch sensor 102 can be reduced as a whole. Likewise, electric fields caused by the linear conductors 102*b*-102 of the touch sensor 102 cancel one another so that noise emitted from the touch sensor 102 itself can be reduced. Therefore, the collision between the bumper 2 and the pedestrian can be surely detected.

When the impact force due to the collision is applied to the touch sensor 102, the touch sensor 102 is short-circuited so that the voltage between the positive and negative terminals 102*g*, 102*h* becomes approximately zero. As a result, the output voltage of the differential amplifier 103*f* also becomes approximately zero. Since the differential amplifier 103*f* amplifies the voltage between the positive and negative terminals 102*g*, 102*h*, the reduction in the resistance of the touch sensor 102 can be surely detected.

The holding circuit 103*g* obtains the output voltage of the differential amplifier 103*f* in the feeding phase, where the second DC voltage is constant. The holding circuit 103*g* holds the obtained output voltage during the communication phase, where the second DC voltage varies. In such an approach, the change in the resistance of the touch sensor 102 can be surely detected, regardless of the fact that the second DC voltage varies.

(Modifications)

The embodiment described above may be modified in various ways. For example, a sensor other than the touch sensor 102 can be used to detect the impact force due to the collision. The touch sensor 102 may be connected to the collision detection circuit 103 via a linear conductor, which is likely to act as an antenna and emit noise. The present invention can be applied to a system other than the pedestrian protection system 1.

Such changes and modifications are to be understood as being within the scope of the present invention as defined by the appended claims.

What is claimed is:

1. A communication system, comprising:

first and second communication wires;

a local device having positive and negative terminals;

a slave controller connected to the first and second communication wires and connected to the positive and negative terminals of the local device, the slave controller being fed with a first direct current voltage via the first and second communication wires and feeding a second direct current voltage to the local device; and a master controller connected to the first and second communication wires, the master controller having a feeding phase for feeding the first direct current voltage to the first and second communication wires and a communication phase for communicating with the slave controller by changing the first direct current voltage in such a manner that voltages on the first and second communication wires are opposite in phase, wherein when the master controller communicates with the slave controller, the slave controller changes the second direct current voltage in such a manner that voltages on the positive and negative terminals of the local device are opposite in phase and vary synchronously with the first direct current voltage;

the feeding phase and the communication phase are repeated;

the slave controller includes a power supply circuit, a voltage change detection circuit, a voltage control circuit, first and second constant current circuits, and a signal ground, the power supply circuit generates the second direct current voltage from the first direct current voltage, the voltage change detection circuit detects a change in the first direct current voltage and outputs a first signal corresponding to the change in the first direct current voltage to the voltage control circuit, the voltage control circuit changes the second direct current voltage in accordance with the first signal, the first constant current circuit is connected between the voltage control circuit and the positive terminal of the local device to feed a constant current to the positive terminal of the local device, and the second constant current circuit is connected between the negative terminal of the local device and the signal ground to draw the constant current from the negative terminal of the local device.

2. The communication system according to claim 1, wherein the local device is a touch sensor including first and second conductors and a resistor connected between the first and second conductors, the first conductor has a first end connected to the resistor and a second end acting as the positive terminal, the second conductor has a first end connected to the resistor and a second end acting as the negative terminal, and when force is applied to the touch sensor, the first and second conductors electrically contact each other so that a resistance between the positive and negative terminals of the touch sensor varies.

3. The communication system according to claim 2, wherein the slave controller further includes a differential amplifier for amplifying a voltage between the positive and negative terminals of the touch sensor.

4. The communication system according to claim 3, wherein the slave controller further includes a holding circuit for holding an output voltage of the differential amplifier, the voltage change detection circuit determines, based on the change in the first direct current voltage, a communication status between the master and slave controllers and outputs a second signal corresponding to the communication status to the holding circuit, and the holding circuit holds the output voltage of the differential amplifier in accordance with the second signal.

5. The communication system according to claim 1, further comprising:

a first linear conductor connected between the positive terminal of the local device and the slave controller; and a second linear conductor connected between the negative terminal of the local device and the slave controller.

6. The communication system according to claim 1, wherein when the master controller communicates with the slave controller, the first and second voltages are pulsed.

7. The communication system according to claim 1, wherein the feeding phase and the communication phase are continuously repeated.

8. The communication system according to claim 1, wherein the first and second communication wires are the only wires connected between the master controller and the slave controller.

* * * * *